(12) United States Patent
Lou

(10) Patent No.: US 11,761,984 B2
(45) Date of Patent: Sep. 19, 2023

(54) PROBE CARD DEVICE AND TESTING EQUIPMENT THEREOF

(71) Applicant: TECAT TECHNOLOGIES (SUZHOU) LIMITED, Suzhou (CN)

(72) Inventor: Choon Leong Lou, Singapore (SG)

(73) Assignee: TECAT TECHNOLOGIES (SUZHOU) LIMITED, Suzhou (CN)

( * ) Notice: Subject to any disclaimer, the term of this patent is extended or adjusted under 35 U.S.C. 154(b) by 0 days.

(21) Appl. No.: 17/528,441

(22) Filed: Nov. 17, 2021

(65) Prior Publication Data

US 2023/0147867 A1 May 11, 2023

(30) Foreign Application Priority Data

Nov. 5, 2021 (CN) .......................... 202111305453.1

(51) Int. Cl.
G01R 1/04 (2006.01)
G01R 1/067 (2006.01)
G01R 1/073 (2006.01)
G01R 31/26 (2020.01)
G01R 31/28 (2006.01)

(52) U.S. Cl.
CPC ..... G01R 1/07378 (2013.01); G01R 1/07342 (2013.01); G01R 31/2889 (2013.01)

(58) Field of Classification Search
CPC .......... G01R 1/04; G01R 1/067; G01R 1/073; G01R 31/02; G01R 31/26; G01R 31/28
See application file for complete search history.

(56) References Cited

U.S. PATENT DOCUMENTS

| 6,911,835 | B2* | 6/2005 | Chraft | G01R 1/07314 324/762.03 |
| 2005/0035775 | A1* | 2/2005 | Zhou | G01R 1/07314 324/755.08 |
| 2010/0176831 | A1* | 7/2010 | Palcisko | G01R 1/07357 324/756.03 |
| 2021/0048451 | A1* | 2/2021 | Yang | G01R 1/06722 |

FOREIGN PATENT DOCUMENTS

TW 200427988 A 12/2004

* cited by examiner

*Primary Examiner* — Neel D Shah
(74) *Attorney, Agent, or Firm* — Muncy, Geissler, Olds & Lowe, P.C.

(57) ABSTRACT

A probe card device includes a printed circuit board (PCB), a space transformer, and a high-speed flexible printed circuit (FPC). The PCB includes a plurality of first connecting bodies coupled to a tester, and a plurality of second connecting bodies. The space transformer includes a plurality of connecting bodies disposed on a first surface of the space transformer and coupled to the plurality of second connecting bodies of the printed circuit board, a plurality of general contact pads disposed on a second surface of the space transformer and contacted with a plurality of first probes, and a plurality of high-speed contact pads disposed on the second surface of the space transformer and contacted with a plurality of second probes. The high-speed FPC has a first connecting terminal coupled to the tester, and a second connecting terminal coupled to the plurality of high-speed contact pads.

21 Claims, 3 Drawing Sheets

PROBE CARD DEVICE AND TESTING EQUIPMENT THEREOF

TECHNICAL FIELD

The present disclosure relates to a probe card device and a testing equipment thereof for testing a semiconductor device, and more particularly, to a probe card device and a testing equipment capable of testing general signals and high-speed signals.

DISCUSSION OF THE BACKGROUND

After the semiconductor devices are manufactured, it is necessary to test the electrical and functional characteristics of newly-completed semiconductor devices so as to ensure that the semiconductor devices can meet the product specifications. However, since the dimensions of the semiconductor devices have been demanded to be smaller and smaller, it also becomes more difficult to test the semiconductor devices in a wafer level. For example, the probes used by the testing equipment must be carefully arranged so the probes can be independent from each other while being aligned with the contact pads of the wafer accurately.

Furthermore, as semiconductor devices include more and more functions, the design of the semiconductor devices also become more and more complicated. For example, the semiconductor devices may need to process signals of different frequencies. However, high-speed signals are more vulnerable to external interference. In such case, since the high-speed signals may be transmitted through signal paths among different interfaces in the testing equipment without proper impedance matching, the quality of the high-speed signals are usually unsatisfactory. Consequently, although a variety of apparatuses have been developed for testing the semiconductor devices nowadays, the structures of the existing apparatuses for testing the semiconductor devices are still inconvenient to use.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a probe card device for semiconductor characteristic measurement. The probe card device includes a printed circuit board, a space transformer, and a high-speed flexible printed circuit. The printed circuit board includes a plurality of first connecting bodies and a plurality of second connecting bodies. The plurality of first connecting bodies are disposed on a first surface of the printed circuit board and coupled to a tester, and the plurality of second connecting bodies are disposed on a second surface of the printed circuit board. The space transformer includes a plurality of connecting bodies, a plurality of general contact pads, and a plurality of high-speed contact pads. The plurality of connecting bodies are disposed on a first surface of the space transformer and coupled to the plurality of second connecting bodies of the printed circuit board. The plurality of general contact pads are disposed on a second surface of the space transformer and contacted with a plurality of first probes, and the plurality of high-speed contact pads are disposed on the second surface of the space transformer and contacted with a plurality of second probes. The high-speed flexible printed circuit has a first connecting terminal coupled to the tester, and a second connecting terminal coupled to the plurality of high-speed contact pads.

In some embodiments, a pitch between two of the plurality of connecting bodies of the space transformer is greater than a pitch between two of the plurality of general contact pads and the plurality of high-speed contact pads.

In some embodiments, the pitch between two of the plurality of connecting bodies of the space transformer is greater than or equal to 250 µm, and the pitch between two of the plurality of general contact pads and the plurality of high-speed contact pads is smaller or equal to 50 µm.

In some embodiments, the first connecting terminal of the high-speed flexible printed circuit is connected to at least one high-speed connector for being coupled to the tester.

In some embodiments, the plurality of general contact pads are disposed in an inner area of the second surface of the space transformer, and the plurality of high-speed contact pads are disposed in a peripheral area outside of the inner area on the second surface of the space transformer.

In some embodiments, a pitch of the first connecting terminal is greater than a pitch of the second connecting terminal.

In some embodiments, the first connecting terminal of the high-speed flexible printed circuit is disposed above or beside the first surface of the printed circuit board, and the second connecting terminal of the high-speed flexible printed circuit is disposed on the second surface of the space transformer.

In some embodiments, the high-speed flexible printed circuit is configured to deliver signals having frequencies greater than 10 GHz.

In some embodiments, the second connecting bodies forms a ball grid array (BGA).

In some embodiments, the plurality of general contact pads and the plurality of high-speed contact pads are controlled collapse chip connection (C4) contact pads.

Another aspect of the present disclosure provides a testing equipment for semiconductor characteristic measurement. The testing equipment includes a probe card device, and a plurality of probes. The probe card device includes a printed circuit board, a space transformer, and a high-speed flexible printed circuit. The printed circuit board includes a plurality of first connecting bodies and a plurality of second connecting bodies. The plurality of first connecting bodies are disposed on a first surface of the printed circuit board, and the plurality of second connecting bodies are disposed on a second surface of the printed circuit board. The space transformer includes a plurality of connecting bodies, a plurality of general contact pads and a plurality of high-speed contact pads. The plurality of connecting bodies are disposed on a first surface of the space transformer and coupled to the plurality of second connecting bodies of the printed circuit board. The plurality of general contact pads are disposed on a second surface of the space transformer, and the plurality of high-speed contact pads are disposed on the second surface of the space transformer. The high-speed flexible printed circuit has a first connecting terminal, and a second connecting terminal coupled to the plurality of high-speed contact pads. The plurality of probes are contacted with the plurality of general contact pads and the plurality of high-speed contact pads.

In some embodiments, the testing equipment further includes a tester coupled to the plurality of first connecting bodies of the printed circuit board and the high-speed flexible printed circuit. The tester generates signals for testing a device under test (DUT) and receives signals outputted by the device under test for analysis.

In some embodiments, the first connecting terminal of the high-speed flexible printed circuit is connected to at least one high-speed connector for being coupled to the tester.

In some embodiments, a pitch between two of the plurality of connecting bodies of the space transformer is greater than a pitch between two of the plurality of general contact pads and the plurality of high-speed contact pads.

In some embodiments, the pitch between two of the plurality of connecting bodies of the space transformer is greater than or equal to 250 μm, and the pitch between two of the plurality of general contact pads and the plurality of high-speed contact pads is smaller or equal to 50 μm.

In some embodiments, the plurality of general contact pads are disposed in an inner area of the second surface of the space transformer, and the plurality of high-speed contact pads are disposed in a peripheral area outside of the inner area on the second surface of the space transformer.

In some embodiments, a pitch of the first connecting terminal of the high-speed flexible printed circuit is greater than a pitch of the second connecting terminal of the high-speed flexible printed circuit.

In some embodiments, the first connecting terminal of the high-speed flexible printed circuit is disposed above or beside the first surface of the printed circuit board, and the second connecting terminal of the high-speed flexible printed circuit is disposed on the second surface of the space transformer.

In some embodiments, the high-speed flexible printed circuit is configured to deliver signals having frequencies greater than 10 GHz.

In some embodiments, the second connecting bodies forms a ball grid array (BGA).

In some embodiments, the plurality of general contact pads and the plurality of high-speed contact pads are controlled collapse chip connection (C4) contact pads.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and which illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
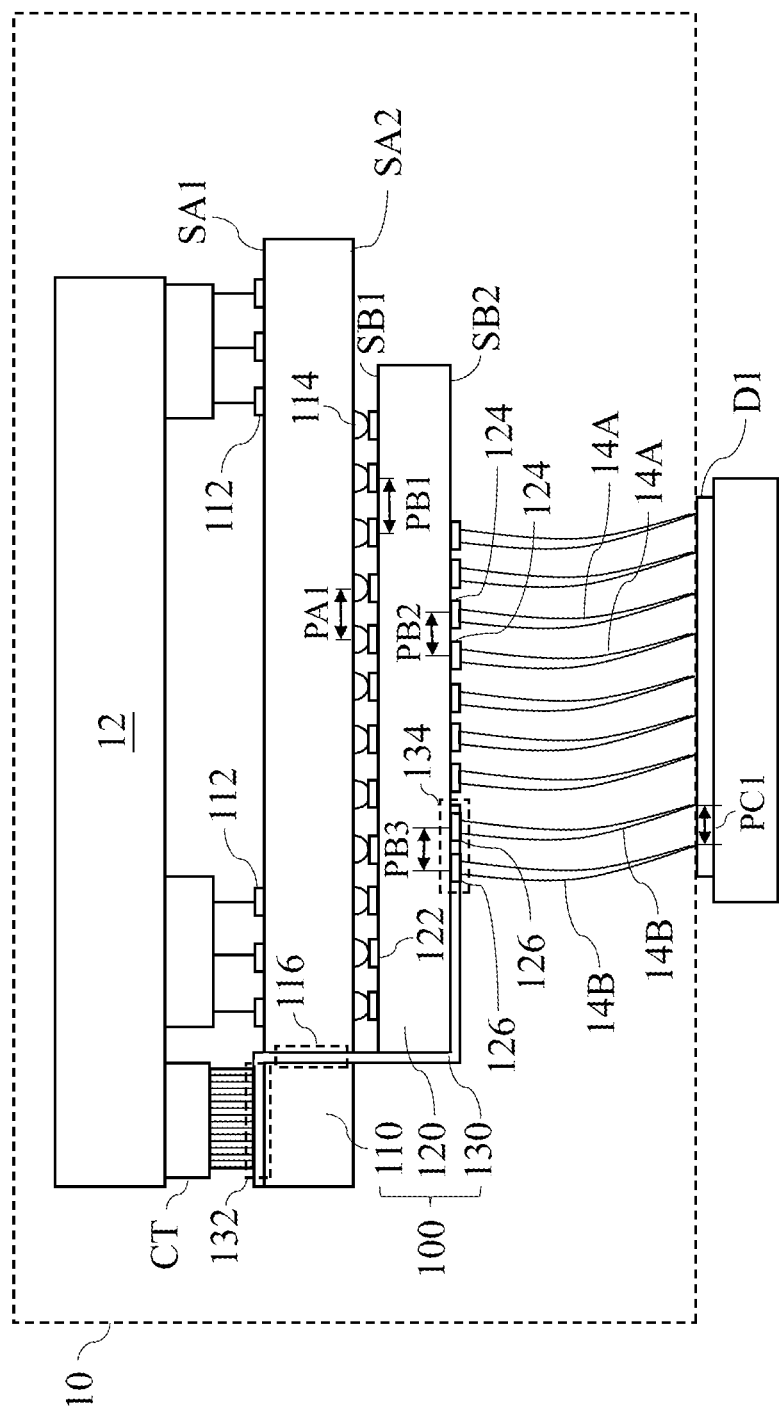
FIG. 1 shows a testing equipment according to one embodiment of the present disclosure.

FIG. 1 shows a testing equipment 10 according to one embodiment of the present disclosure. The testing equipment 10 can be used to test the device under test (DUT) D1. In some embodiments, the device under test D1 can be a semiconductor device of a wafer level. In such case, the testing equipment 10 can include a tester 12, a probe card device 100 and a plurality of probes 14A and 14B.

The tester 12 can generate signals for testing the device under test D1 and receive signals outputted by the device under test D1 for analysis. For example, the tester 12 may generate input signals, including data signals and control signals, for the device under test D1 so the device under test D1 would perform corresponding operations according to the input signals. Afterwards, the tester 12 can further receive the output signals generated by the device under test D1 for analysis so as to determine whether the device under test D1 can fulfill the desired function and meet the product specification.

Since the tester 12 is usually designed in a dimension much greater than the dimension of the device under test D1, the probe card device 100 and the probes 14A and 14B may be used as input/output interfaces between the tester 12 and the device under test D1 for delivering the testing signals between terminals of different pitches.

In FIG. 1, the probe card device 100 includes a printed circuit board (PCB) 110, a space transformer (ST) 120, and a high-speed flexible printed circuit (FPC) 130.

The printed circuit board 110 includes a plurality of first connecting bodies 112 and a plurality of second connecting bodies 114. The first connecting bodies 112 can be disposed on a first surface SA1 of the printed circuit board 110 and can be coupled to the tester 10. Also, the second connecting bodies 114 can be disposed on a second surface SA2 of the printed circuit board 110.

The space transformer 120 includes a plurality of connecting bodies 122, a plurality of general contact pads 124, and a plurality of high-speed contact pads 126. The connecting bodies 122 can be disposed on a first surface SB1 of the space transformer 120 and can be coupled to the second connecting bodies 114 of the printed circuit board 110. The general contact pads 124 can be disposed on a second surface SB2 of the space transformer 120 and can be contacted with a plurality of first probes 14A. Also, the high-speed contact pads 126 can be disposed on the second surface SB2 of the space transformer 120 and can be contacted with a plurality of second probes 14B.

In some embodiments, the pitch PA1 between two of the second connecting bodies 114 of the printed circuit board 110 may be much greater than the pitch PC1 between the pads of the device under test D1. Therefore, the space transformer 120 can be used to transform the pitches of the two different interfaces of the printed circuit board 110 and the device tinder test D1. That is, the pitch PB1 between the connecting bodies 122 of the space transformer 120 is greater than the pitch PB2 between two of the general contact pads 124 and the pitch PB3 between two of the high-speed contact pads 126. For example, the second connecting bodies 114 of the printed circuit board 110 may form a ball grid array (BGA) while the plurality of general contact pads 124 and the high-speed contact pads 126 can be controlled collapse chip connection (C4) contact pads. In such case, the pitch PB1 between two of the connecting bodies 122 of the space transformer 120 may be greater than or equal to 250 μm, and the pitch PB2 between two of the general contact pads 124 and the pitch PB3 between two of the high-speed contact pads 126 can be smaller or equal to 50 μm.

In FIG. 1, the general signals can be transmitted between the tester 12 and the device under test D1 through the inner paths of the printed circuit board PCB, the inner paths of the space transformer 120, and the probes 14A. In some embodiments, frequencies of general signals may be, for example but not limited to, lower than 1 GHz, and thus, the transmission condition of the signal paths provided by the printed circuit board 110 and the space transformer 120 may be acceptable. However, for high-speed signals having frequencies greater than 10 GHz, for example but not limited to signals of PCIe 2.0, SATA 3.0 and Display port (DP), the transmission condition of the signal paths provided by the printed circuit board 110 and the space transformer 120 may be unacceptable for severe distortion can be caused during the transmission. To address such issue, the high-speed flexible printed circuit 130 is adopted to provide a better transmission condition for the high-speed signal.

In some embodiments, the high-speed flexible printed circuit 130 can deliver signals having frequencies greater than 10 GHz. The high-speed flexible printed circuit 130 has a first connecting terminal 132 coupled to the tester 12, and a second connecting terminal 134 coupled to the high-speed contact pads 126. Also, in some embodiments, the first connecting terminal 132 of the high-speed flexible printed circuit 130 can be connected to the high-speed connector CT for being coupled to the tester 12. That is, the high-speed signal can be delivered between the tester 12 and the device under test D1 through the high-speed flexible printed circuit 130 and the probes 14B, thereby avoiding the interference caused within the signals paths provided by the printed circuit board 110 and the space transformer 120.

Figure 2:
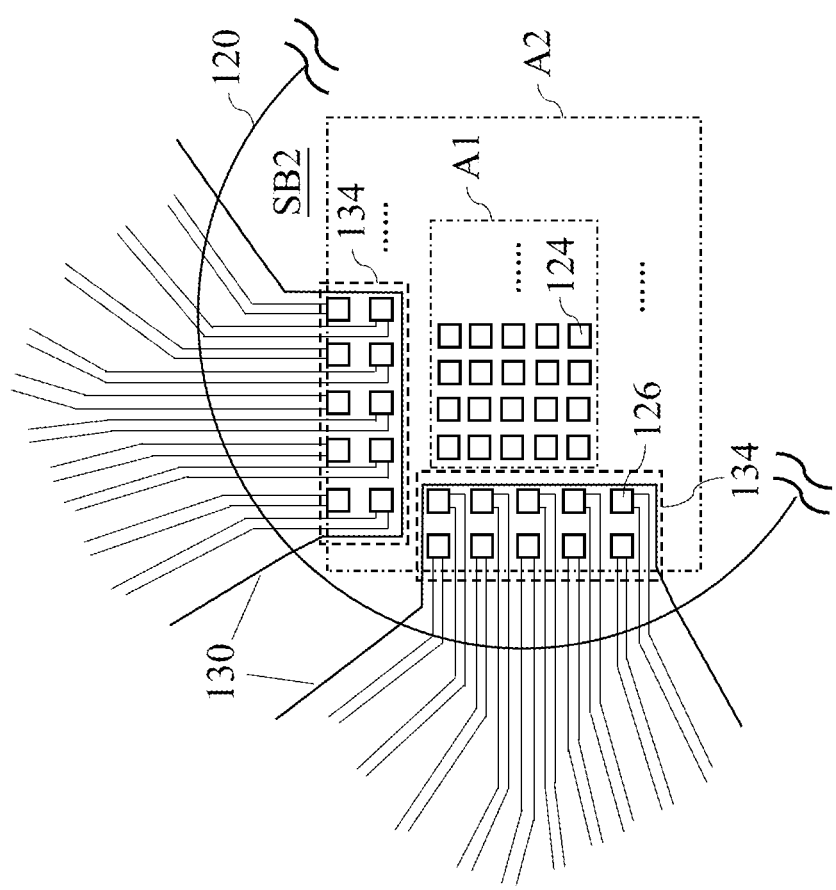
FIG. 2 shows a portion of the second surface of the second surface space transformer and the high-speed flexible printed circuit of the testing equipment in FIG. 1 according to one embodiment of the present disclosure.

FIG. 2 shows a portion of the second surface SB2 of the second surface SB2 space transformer 120 and the high-speed flexible printed circuit 130 according to one embodiment of the present disclosure. In FIG. 2, the general contact pads 124 can be disposed in an inner area A1 of the second surface SB2 of the space transformer 120, and the high-speed contact pads 126 can be disposed in a peripheral area A2 outside of the inner area A1 on the second surface SB2 of the space transformer 120. Therefore, the high-speed flexible printed circuit 130 can be connected to the high-speed contact pads 126 directly without entering the inner area A1 and passing by the general contact pads 124, thereby keeping the routing of the traces in the high-speed flexible printed circuit 130 simple and reducing unwanted interferences.

Also, in FIG. 2, the pitch between the traces at the second connecting terminal 134 of the high-speed flexible printed circuit 130 can be expanded. Consequently, the pitch of the first connecting terminal 132 can be greater than the pitch of the second connecting terminal 134 the so the pitch of the second connecting terminal 134 can be complied with the pitch PA1 of the printed circuit board 110.

In FIG. 1, the printed circuit board 110 can have a slot 116 so that the high-speed flexible printed circuit 130 can be extended from its first connecting terminal 132 to its second connecting terminal 134 through the slot 116. Consequently, the first connecting terminal 132 of the high-speed flexible printed circuit 130 can be disposed above or beside the first surface SA1 of the printed circuit board 110, allowing the tester 12 to be connected with the high-speed flexible printed circuit 130 conveniently.

Figure 3:
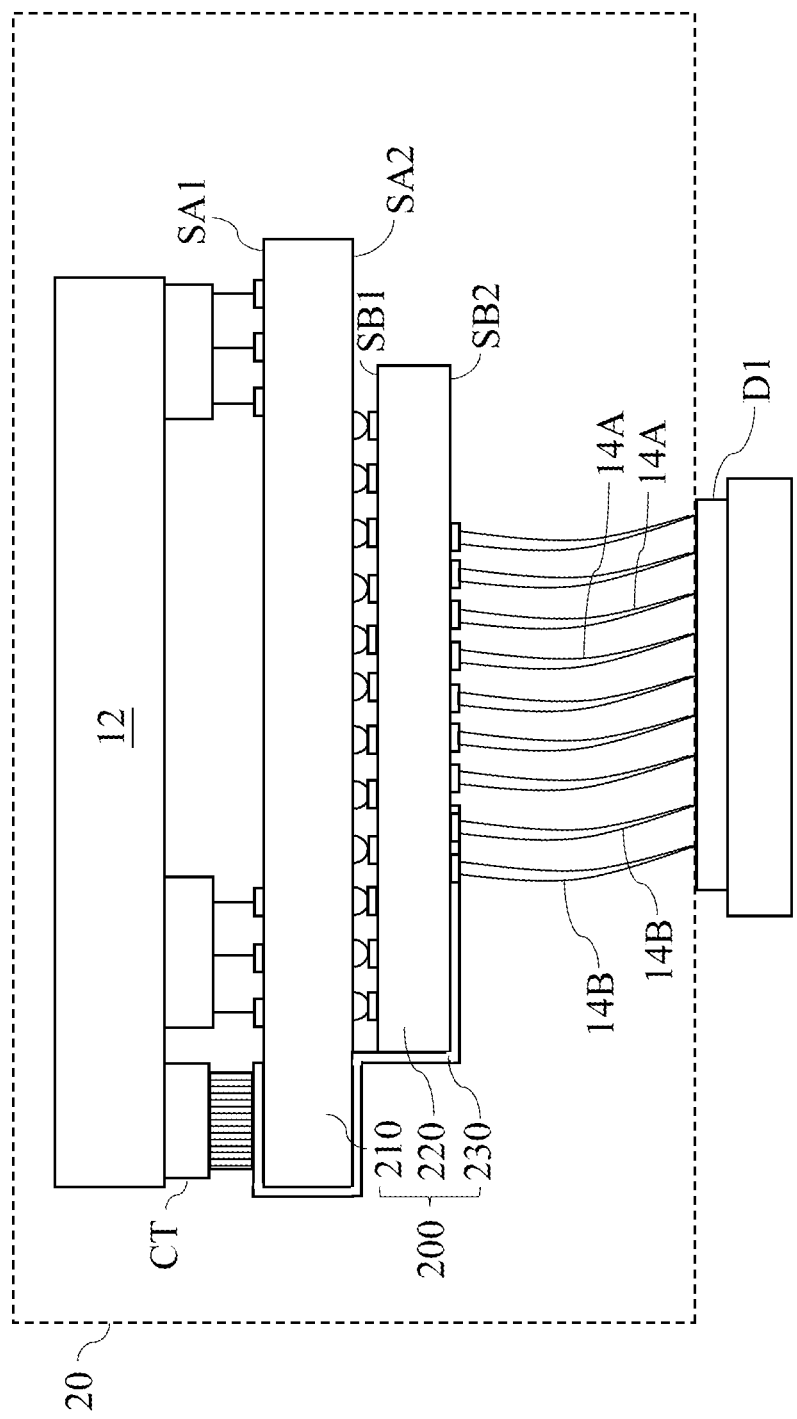
FIG. 3 shows a testing equipment according to another embodiment of the present disclosure.

FIG. 3 shows a testing equipment 20 according to another embodiment of the present disclosure. The testing equipment 20 can have the similar structure as the testing equipment 10. However, in FIG. 3, the printed circuit board 210 of the probe card device 200 does not include the slot 116 for the high-speed flexible printed circuit 230 to pass through. Instead, the high-speed flexible printed circuit 230 can be extended along the second surface SB2 of the space transformer 220 and the second surface SA2 of the printed circuit board 210 to the first surface SA1 of the printed circuit board 210. Consequently, the tester 12 can still be connected with the high-speed flexible printed circuit 230 conveniently.

In summary, the probe card device and the testing system equipment provided by the embodiments of the present disclosure can deliver the high-speed signals by using high-speed flexible printed circuit, thereby improving the signal quality by avoiding the interference caused by the signal paths within the printed circuit board and the space transformer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:
1. A probe card device comprising:
   a printed circuit board comprising:
      a plurality of first connecting bodies disposed on a first surface of the printed circuit board and coupled to a tester; and a plurality of second connecting bodies disposed on a second surface of the printed circuit board;
a space transformer comprising:
a plurality of connecting bodies disposed on a first surface of the space transformer and coupled to the plurality of second connecting bodies of the printed circuit board;
a plurality of general contact pads disposed on a second surface of the space transformer and contacted with a plurality of first probes; and
a plurality of high-speed contact pads disposed on the second surface of the space transformer and contacted with a plurality of second probes; and
a high-speed flexible printed circuit having a first connecting terminal coupled to the tester, and a second connecting terminal coupled to the plurality of high-speed contact pads, wherein the second connecting terminal of the high-speed flexible printed circuit is directly coupled to the hi h-speed contact pads.

2. The probe card device of claim 1, wherein:
a pitch between two of the plurality of connecting bodies of the space transformer is greater than a pitch between two of the plurality of general contact pads and a pitch between two of the plurality of high-speed contact pads.

3. The probe card device of claim 2, wherein:
the pitch between two of the plurality of connecting bodies of the space transformer is greater than or equal to 250 μm; and
the pitch between two of the plurality of general contact pads and the pitch between two of the plurality of high-speed contact pads is smaller or equal to 50 μm.

4. The probe card device of claim 1, wherein:
the first connecting terminal of the high-speed flexible printed circuit is connected to a high-speed connector for being coupled to the tester.

5. The probe card device of claim 1, wherein:
the plurality of general contact pads are disposed in an inner area of the second surface of the space transformer; and
the plurality of high-speed contact pads are disposed in a peripheral area outside of the inner area on the second surface of the space transformer.

6. The probe card device of claim 1, wherein a pitch of the first connecting terminal is greater than a pitch of the second connecting terminal.

7. The probe card device of claim 1, wherein:
the first connecting terminal of the high-speed flexible printed circuit is disposed above or beside the first surface of the printed circuit board; and
the second connecting terminal of the high-speed flexible printed circuit is disposed on the second surface of the space transformer.

8. The probe card device of claim 1, wherein the high-speed flexible printed circuit is configured to deliver signals having frequencies greater than 10 GHz.

9. The probe card device of claim 1, wherein the second connecting bodies forms a ball grid array (BGA).

10. The probe card device of claim 1, wherein the plurality of general contact pads and the plurality of high-speed contact pads are controlled collapse chip connection (C4) contact pads.

11. A testing equipment comprising:
a probe card device comprising:
a printed circuit board comprising:
a plurality of first connecting bodies disposed on a first surface of the printed circuit board; and
a plurality of second connecting bodies disposed on a second surface of the printed circuit board;
a space transformer comprising:
a plurality of connecting bodies disposed on a first surface of the space transformer and coupled to the plurality of second connecting bodies of the printed circuit board;
a plurality of general contact pads disposed on a second surface of the space transformer; and
a plurality of high-speed contact pads disposed on the second surface of the space transformer; and
a high-speed flexible printed circuit having a first connecting terminal, and a second connecting terminal coupled to the plurality of high-speed contact pads; and
a plurality of probes respectively contacted with the plurality of general contact pads and the plurality of high-speed contact pads, wherein the second connecting terminal of the high-speed flexible printed circuit is directly coupled to the high-speed contact pads.

12. The testing equipment of claim 11 further comprising:
a tester coupled to the plurality of first connecting bodies of the printed circuit board and the high-speed flexible printed circuit, and configured to generate signals for testing a device under test (DUT) and receive signals outputted by the device under test for analysis.

13. The testing equipment of claim 12, wherein:
the first connecting terminal of the high-speed flexible printed circuit is connected to at least one high-speed connector for being coupled to the tester.

14. The testing equipment of claim 11, wherein:
a pitch between two of the plurality of connecting bodies of the space transformer is greater than a pitch between two of the plurality of general contact pads and a pitch between two of the plurality of high-speed contact pads.

15. The testing equipment of claim 14, wherein:
the pitch between two of the plurality of connecting bodies of the space transformer is greater than or equal to 250 μm; and
the pitch between two of the plurality of general contact pads and the pitch between two of the plurality of high-speed contact pads is smaller or equal to 50 μm.

16. The testing equipment of claim 11, wherein:
the plurality of general contact pads are disposed in an inner area of the second surface of the space transformer; and
the plurality of high-speed contact pads are disposed in a peripheral area outside of the inner area on the second surface of the space transformer.

17. The testing equipment of claim 11, wherein a pitch of the first connecting terminal of the high-speed flexible printed circuit is greater than a pitch of the second connecting terminal of the high-speed flexible printed circuit.

18. The testing equipment of claim 11, wherein:
the first connecting terminal of the high-speed flexible printed circuit is disposed above or beside the first surface of the printed circuit board; and
the second connecting terminal of the high-speed flexible printed circuit is disposed on the second surface of the space transformer.

19. The testing equipment of claim 11, the high-speed flexible printed circuit is configured to deliver signals having frequencies greater than 10 GHz.

20. The testing equipment of claim 11, wherein the second connecting bodies forms a ball grid array (BGA).

21. The testing equipment of claim 11, wherein the plurality of general contact pads and the plurality of high-speed contact pads are controlled collapse chip connection (C4) contact pads.

\* \* \* \* \*